(12) United States Patent
Cho et al.

(10) Patent No.: US 11,173,439 B2
(45) Date of Patent: Nov. 16, 2021

(54) FLOW PATH SWITCHING TYPE COLLECTING APPARATUS OF BY-PRODUCT FOR SEMICONDUCTOR MANUFACTURING PROCESS

(71) Applicant: MILAEBO CO., LTD., Pyeongtaek-si (KR)

(72) Inventors: Che Hoo Cho, Seongnam-si (KR); Jae Jun Lee, Hwaseong-si (KR); Myung Pil Han, Yongin-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 258 days.

(21) Appl. No.: 16/677,640

(22) Filed: Nov. 7, 2019

(65) Prior Publication Data

US 2021/0053002 A1 Feb. 25, 2021

(30) Foreign Application Priority Data

Aug. 21, 2019 (KR) .......................... 10-2019-0102355

(51) Int. Cl.
*B01D 45/00* (2006.01)
*B01D 45/06* (2006.01)
*H01L 21/67* (2006.01)
*C23C 16/44* (2006.01)
*B01D 45/08* (2006.01)

(52) U.S. Cl.
CPC ............ *B01D 45/06* (2013.01); *B01D 45/08* (2013.01); *C23C 16/4412* (2013.01); *H01L 21/67017* (2013.01)

(58) Field of Classification Search
CPC ...... B01D 45/06; B01D 46/106; B01D 45/08; B01D 46/0021; B01D 2258/0216; H01L 21/67017; C23C 16/4412
See application file for complete search history.

(56) References Cited

U.S. PATENT DOCUMENTS 512,681 A * 1/1894 Clute .................... B01D 45/08
55/446
1,653,203 A * 12/1927 Connally .............. B60T 17/004
137/203

(Continued)

FOREIGN PATENT DOCUMENTS

KR 100717837 B1 5/2007
KR 100862684 B1 10/2008

(Continued)

*Primary Examiner* — Dung H Bui
(74) *Attorney, Agent, or Firm* — Rabin & Berdo, P.C.

(57) ABSTRACT

The flow path switching type collecting apparatus of by-products for a semiconductor manufacturing process of the present disclosure includes: a cylindrical housing that has a top plate having a gas inlet and a bottom plate having a gas outlet and fastening portions extending and protruding inside the housing, and receives and then discharges an exhaust gas flowing inside; and a flow path switching type disc collection tower that is installed vertically in the housing and includes an open edge-mesh center type collection disc, a mesh edge-open center type collection disc, a solid edge-open center type collection disc, and an open edge-solid center type collection disc that have different external shape to collect by-products of an exhaust gas flowing insides.

8 Claims, 7 Drawing Sheets

(56) References Cited

U.S. PATENT DOCUMENTS

| | | | | |
|---|---|---|---|---|
| 1,857,348 | A * | 5/1932 | Bokenkroger | B01D 46/00 55/446 |
| 2,732,033 | A * | 1/1956 | Parks | B01D 45/08 55/391 |
| 3,693,457 | A * | 9/1972 | Pilat | G01N 15/0255 73/865.5 |
| 3,983,743 | A * | 10/1976 | Olin | G01N 1/2247 73/28.06 |
| 4,189,937 | A * | 2/1980 | Nelson | B01D 45/08 73/28.06 |
| 4,387,603 | A * | 6/1983 | Nelson | B01D 45/08 73/863.22 |
| 4,488,887 | A * | 12/1984 | Angel | B01D 8/00 55/308 |
| 4,904,621 | A * | 2/1990 | Loewenstein | G03F 7/427 118/50.1 |
| 5,041,146 | A * | 8/1991 | Simmerlein-Erlbacher | B01D 45/10 96/57 |
| 5,384,044 | A * | 1/1995 | Burgess | B01D 45/08 210/346 |
| 6,156,107 | A * | 12/2000 | Hayashi | B01D 45/08 438/905 |
| 6,447,158 | B1 * | 9/2002 | Farkas | B01F 5/0471 366/169.1 |
| 6,521,010 | B1 * | 2/2003 | Katata | B01D 45/08 55/434 |
| 6,576,045 | B2 * | 6/2003 | Liu | F01N 3/0222 95/268 |
| 7,491,292 | B2 * | 2/2009 | Han | C23C 16/4412 156/345.29 |
| 7,837,770 | B2 * | 11/2010 | Lee | B01D 53/002 95/290 |
| 10,239,004 | B2 * | 3/2019 | Bratek | G01L 9/0052 |
| 2007/0107595 | A1 * | 5/2007 | Na | B01D 53/40 95/288 |
| 2009/0107091 | A1 * | 4/2009 | Cho | C23C 16/4412 55/434.2 |
| 2009/0217634 | A1 * | 9/2009 | Choi | B01D 45/08 55/426 |
| 2011/0252969 | A1 * | 10/2011 | Fischer | C23C 16/4412 95/272 |
| 2014/0059985 | A1 * | 3/2014 | Janakiraman | B01D 45/16 55/459.4 |
| 2016/0175749 | A1 * | 6/2016 | Suda | B01D 45/12 95/269 |
| 2016/0228799 | A1 * | 8/2016 | Chen | B01D 46/0021 |
| 2018/0104630 | A1 * | 4/2018 | Miyanaga | F01M 13/04 |
| 2020/0164296 | A1 * | 5/2020 | Cho | H01L 21/67017 |
| 2020/0217559 | A1 * | 7/2020 | Hwang | H01L 21/67017 |
| 2020/0321226 | A1 * | 10/2020 | Cho | H01L 21/67109 |
| 2021/0039034 | A1 * | 2/2021 | Cho | B01D 46/24 |

FOREIGN PATENT DOCUMENTS

| | | |
|---|---|---|
| KR | 101447629 B1 | 10/2014 |
| KR | 101806480 B1 | 1/2018 |

* cited by examiner

FLOW PATH SWITCHING TYPE COLLECTING APPARATUS OF BY-PRODUCT FOR SEMICONDUCTOR MANUFACTURING PROCESS

CROSS-REFERENCE TO RELATED APPLICATIONS

This application claims the priority of Korean Patent Application No. 10-2019-0102355 filed on Aug. 21, 2019, in the Korean Intellectual Property Office, the disclosure of which is incorporated herein by reference.

BACKGROUND

Field

The present disclosure relates to a flow path switching type collecting apparatus of by-products for a semiconductor manufacturing process and, more particularly, to a secondary by-product collection apparatus that is disposed at a rear end of a by-product collection apparatus for collecting by-products contained in an exhaust gas discharged from a process chamber for manufacturing a semiconductor and removes a small amount of non-collected by-products remaining in the exhaust gas with by-products primarily removed through a multi-stage collection process by switching flow path directions of the exhaust gas.

Description of the Related Art

In general, a semiconductor manufacturing process is composed of a pre-process (fabrication process) and a post-process (assembly process) in a broad meaning.

The pre-process refers to a semiconductor chip manufacturing process of forming a specific pattern by repeatedly performing a process of depositing a thin film on a wafer in various process chambers and selectively etching the deposited thin film.

Further, the post-process refers to a package process of individually cutting and separating the chips manufacturing on the wafer in the pre-process and then combining the chips with lead frames, thereby assembling the chips into complete products.

In more detail, the pre-process refers to a process of depositing a thin film on a wafer or etching a thin film deposited on a wafer. To this end, a thin film depositing process at a high temperature is performed by selectively injecting any one or more of reaction gases such as $SiH_4$ (silane), arsine, boron chloride, hydrogen, $WF_6$ (tungsten hexafluoride), $TiCl_4$ (titanium tetrachloride), and $NH_3$ (ammonia) into a process chamber, depending on processes. In this case, a large amount of various ignitable gases and noxious gases containing corrosive foreign substances and noxious components are produced in the process chamber.

In order to purify and discharge such noxious gases, semiconductor manufacturing equipment is equipped with a vacuum pump that makes a process chamber vacuum, and a scrubber that purifies an exhaust gas discharged from the process chamber and the discharge the purified exhaust gas to the atmosphere at the rear end of the vacuum pump.

However, since the scrubber purifies and processes only gaseous by-products, when by-products solidify after discharged out of a process chamber, several problems are caused, for example, the by-products increase exhaust pressure by sticking in an exhaust line or cause breakdown of a pump by entering a vacuum pump, or noxious gases contaminate a wafer by flowing backward to the process chamber.

Accordingly, semiconductor manufacturing equipment is configured to concentrate an exhaust gas that is discharged from a process chamber by installing an apparatus for collecting by-products between the process chamber and a vacuum pump.

Such an apparatus for collecting by-products is connected with a process chamber and a vacuum pump through a pumping line, and concentrates and collects particulate by-products contained in an exhaust gas discharged after reaction from the process chamber.

However, as client companies change their processes and the amount of reaction gas increases, it is difficult to completely remove by-products using only such an apparatus for collecting by-products, as described above. Accordingly, there is a problem in that non-collected particulate by-products may remain in a discharged exhaust gas and thus damage a vacuum pump.

PRIOR ART DOCUMENT

Patent Document (Patent Document 1) Koreatn Patent No. 10-0717837 (2007 May 7)
(Patent Document 2) Koreatn Patent No. 10-0862684 (2008 Oct. 2)
(Patent Document 3) Koreatn Patent No. 10-1447629 (2014 Sep. 29)
(Patent Document 4) Koreatn Patent No. 10-1806480 (2017 Dec. 1)

SUMMARY

In order to solve the problems described above, an object of the present invention is to provide an apparatus for collecting by-products, the apparatus being disposed between a primary by-product collection apparatus and a vacuum pump in a semiconductor manufacturing process and collecting by-products with high efficiency through collection discs, which have various shapes and are vertically arranged by combining positions up and down to remove again non-collected by-products contained in an exhaust gas discharged from the primary by-product collection apparatus in the previous process, by adjusting the flow path direction and movement speed of the exhaust gas flowing inside.

In order to achieved the objects and remove the problems in the related art, the present disclosure provides an apparatus for collecting by-products that collects again non-collected by-products, which are contained in an exhaust gas that has passed through a primary by-product collection apparatus collecting by-products of an exhaust gas discharged from a process chamber for a semiconductor process, and supplies the exhaust gas to a vacuum pump.

The apparatus includes: a cylindrical housing that has a top plate having a gas inlet and a bottom plate having a gas outlet and fastening portions extending and protruding inside the housing, and receives and then discharges an exhaust gas flowing inside; and a flow path switching type disc collection tower that is installed vertically in the housing and collects by-products of an exhaust gas flowing insides, in which the flow path switching type disc collection tower includes: one or more open edge-mesh center type collection discs, mesh edge-open center type collection discs, solid edge-open center type collection discs, and open edge-solid center type collection discs which have different external shapes and are arranged up and down; spacer rods disposed vertically through the collection discs to integrate the discs with predetermined gap therebetween; and supports installed to space the collection discs, which are integrated with predetermined gaps therebetween, from a top surface of the bottom plate of the housing to be positioned over the gas outlet.

As a preferred embodiment, a vertical arrangement structure of the flow path switching type disc collection tower is configured such that the collection discs are vertically arranged in order of the open edge-mesh center type collection disc, the mesh edge-open center type collection disc, the open edge-mesh center type collection disc, the solid edge-open center type collection disc, the open edge-solid center type collection disc, the solid edge-open center type collection disc, and the open edge-solid center type collection disc from an upper top so that by-products are collected first at a lower portion and then gradually collected at an upper portion as the exhaust gas flows down while flowing zigzag through a center and an edge area of the housing.

As a preferred embodiment, the open edge-mesh center type collection disc is composed of a mesh portion formed at a planar center portion, a plurality of openings circumferentially arranged around the plane, and a guide edge protruding vertically along a circumference; a plurality of fastening holes is circumferentially arranged on the plane between the mesh portion and the openings to pass the spacer rods; and support holes through which the supports are inserted are formed at at least two of planes between adjacent openings.

As a preferred embodiment, the open edge-mesh center type collection disc is composed of an opening formed at a planar center portion, two mesh portions circumferentially formed around the plane, and a guide edge protruding vertically along a circumference; a plurality of fastening holes is circumferentially arranged on the plane between the mesh portions and the opening to pass the spacer rods; and support holes through which the supports are inserted are formed at at least two of planes between adjacent mesh portions.

As a preferred embodiment, the solid edge-open center type collection disc is composed of a opening formed at a planar center portion, and a guide edge protruding vertically upward along a circumference; a plurality of fastening holes is circumferentially arranged around the opening on the plane without the opening to pass the spacer rods; and support holes through which the supports are inserted are formed at at least two of planes without the opening.

As a preferred embodiment, the open edge-solid center type collection disc is composed of a plurality of openings circularly formed around a plane, and a guide edge protruding vertically upward along a circumference; a plurality of fastening holes is circumferentially arranged around the plane on the center without the opening to pass the spacer rods; and support holes through which the supports are inserted are formed at at least two of the planes between adjacent openings.

As a preferred embodiment, the spacer rods that are individual rods are disposed vertically through the fastening holes formed at the same positions on the planes of the open edge-mesh center type collection disc, the mesh edge-open center type collection disc, the solid edge-open center type collection disc, and the open edge-solid center type collection disc, and then fixed by welding contact portions with the fastening holes, and space the collection discs by a gap considering a growth size (<5 mm) of by-products.

As a preferred embodiment, the supports are each composed of a rod-shaped external pipe and a rod-shaped bolt having a thread and inserted in the external pipe; the external pipes are disposed vertically through the support holes formed at the same positions on the planes of the open edge-mesh center type collection disc, the mesh edge-open center type collection disc, the solid edge-open center type collection disc, and the open edge-solid center type collection disc, and the contact portions with the support holes are welded, thereby being integrally fixed; lower ends of the bolts of the supports are inserted and fixed by thread-fastening in two or more fastening portions formed on the top surface of the bottom plate of the housing; and upper ends of the bolts of the supports are disposed through the support holes of the open edge-mesh center type collection disc and fastened by nuts, whereby the positions of the upper ends may be fixed.

An apparatus for collecting by-products according to the present disclosure having the above described properties includes an apparatus for collecting by-products, the apparatus being disposed between a primary by-product collection apparatus and a vacuum pump in a semiconductor manufacturing process and including a flow path switching type disc collection tower, in which collection discs, which have various shapes and are arranged by combining positions up and down are arranged, in a housing to remove again non-collected by-products contained in an exhaust gas discharged from the primary by-product collection apparatus in the previous process.

By adjusting the flow direction and movement speed of an exhaust gas flowing inside, when the exhaust gas sequentially flows through the collection discs vertically arranged in multiple stages, the direction of the exhaust gas changed zigzag and vortexes are generated by long path and a movement speed difference between main flow by the lateral direction and openings and sub-flow by meshes. Accordingly, the collection time and the number of hitting of by-products are sufficiently increased at the collection discs, there is an effect that it is possible to remove non-collected by-products contained in the exhaust gas with high efficiency.

Further, by positioning the mesh type collection discs upstream, by-products are collected first through the collection discs having a solid structure and positioned blow and then sequentially collected toward the upper end rather than being collected first at the upper end of the flow path switching type disc collection tower by guiding an initial exhaust gas flowing into the housing through the gas inlet toward the solid collection discs, thereby having effect that the collection area can be used with high efficiency.

Further, the collection discs of the flow path switching type disc collection tower are spaced up and down with predetermined gaps, thus there is an effect that it is possible to smoothly and continuously collect by-products with high efficiency in consideration of the growing size (<5 mm) of by-products.

The present disclosure is an invention that has various effects and that is expected to be widely used in industry.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereafter, configuration and operation that are embodiments of the present disclosure are described in detail with reference to the accompanying drawings. Further, in describing the present disclosure, detailed descriptions of well-known functions or configurations relating to the present disclosure will not be provided so as not to obscure the description of the present disclosure with unnecessary details.

Figure 1:
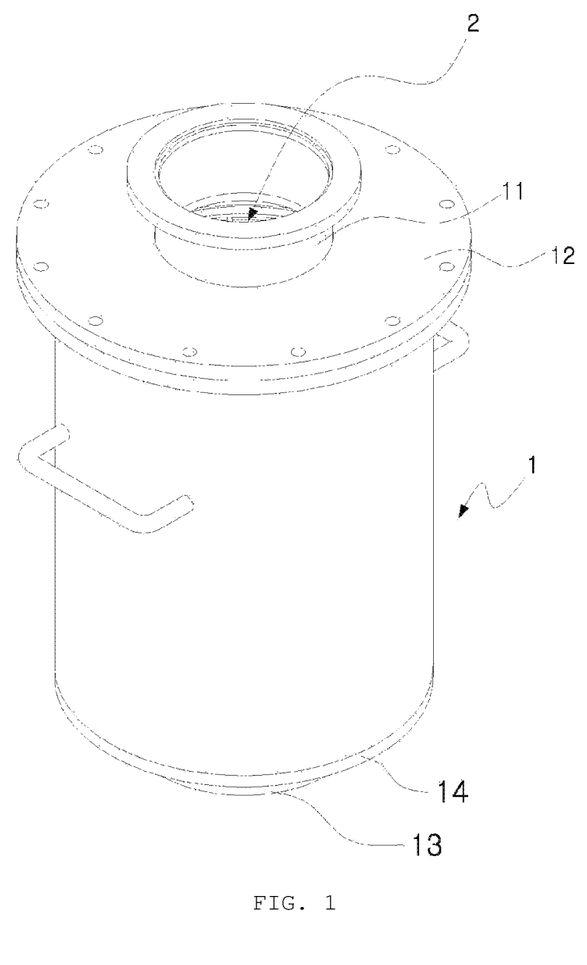
FIG. 1 is a perspective view of an apparatus for collecting by-products according to an embodiment of the present disclosure.
Figure 2:
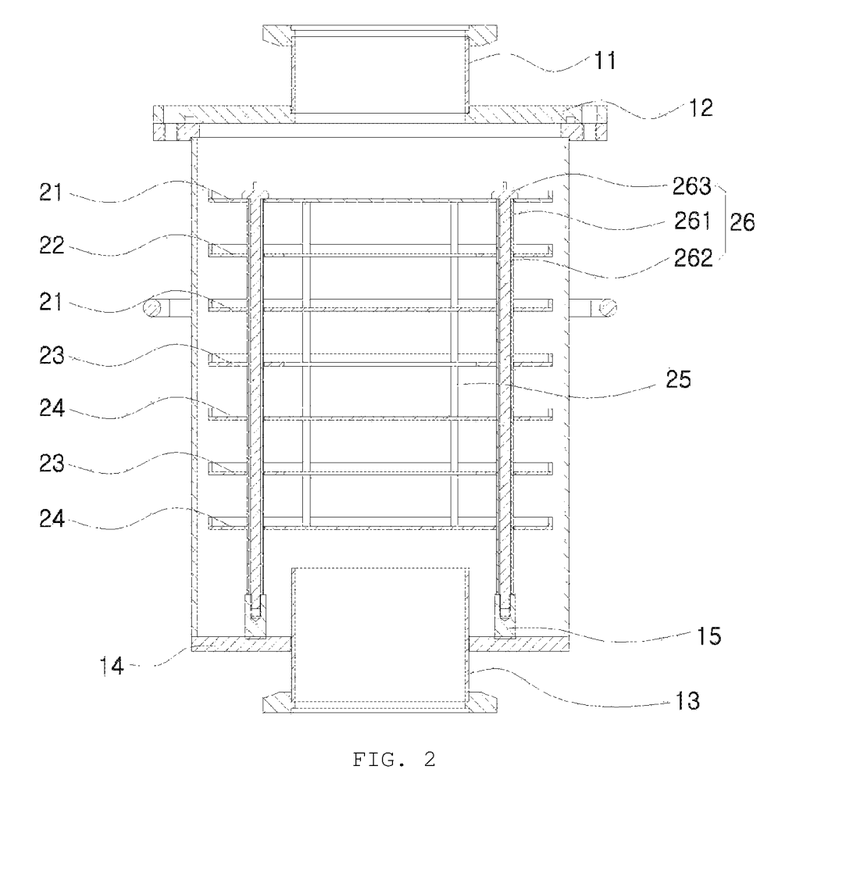
FIG. 2 is a cross-sectional view of an apparatus for collecting by-products according to an embodiment of the present disclosure.
Figure 3:
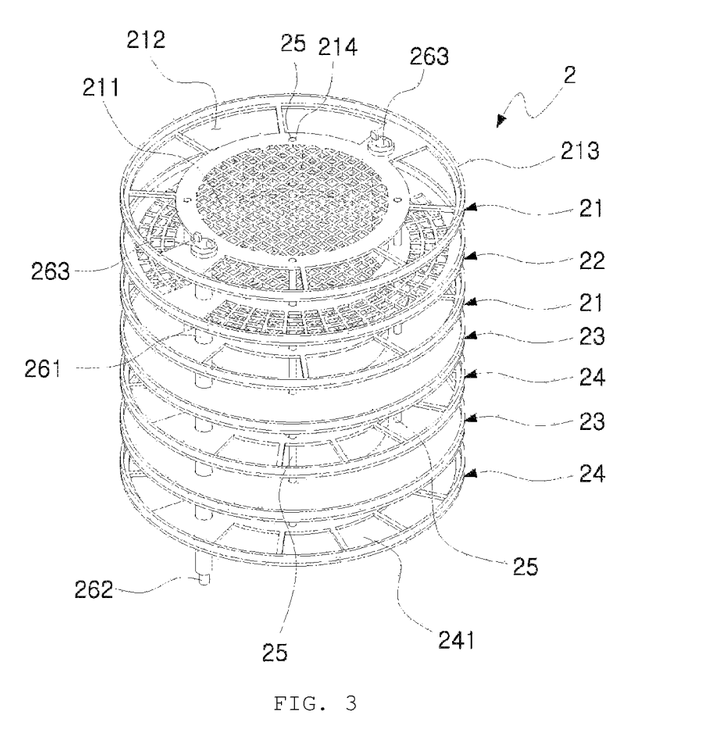
FIG. 3 is an entire configuration view of a flow path switching type disc collection tower according to an embodiment of the present disclosure.
Figure 4:
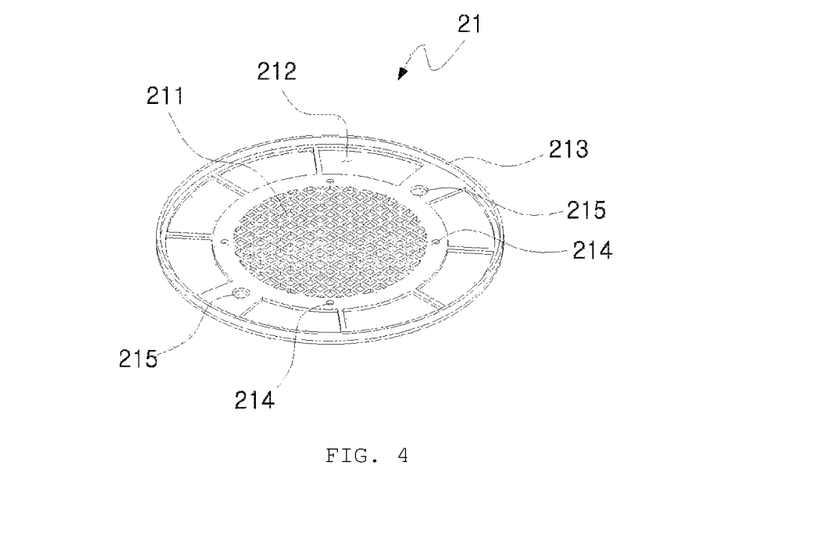
FIG. 4 is a configuration view of an open edge-mesh center type collection disc according to an embodiment of the present disclosure.
Figure 5:
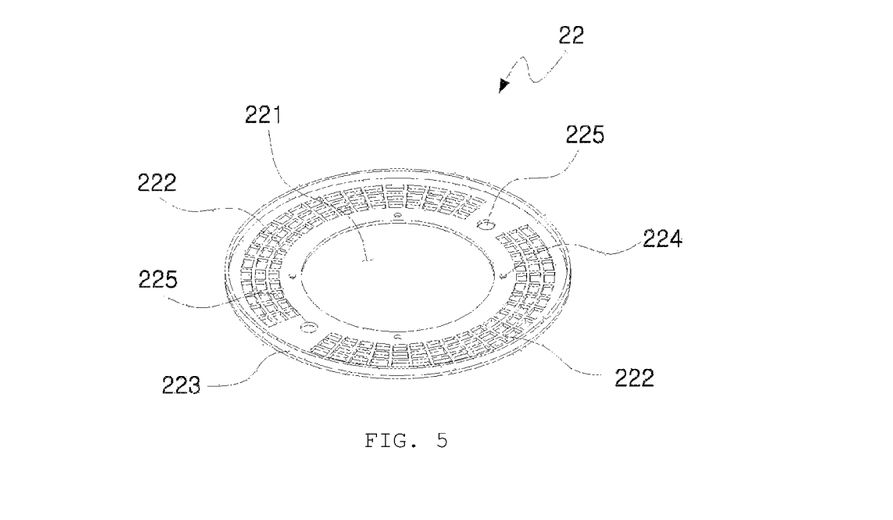
FIG. 5 is a configuration view of a mesh edge-open center type collection disc according to another embodiment of the present disclosure.
Figure 6:
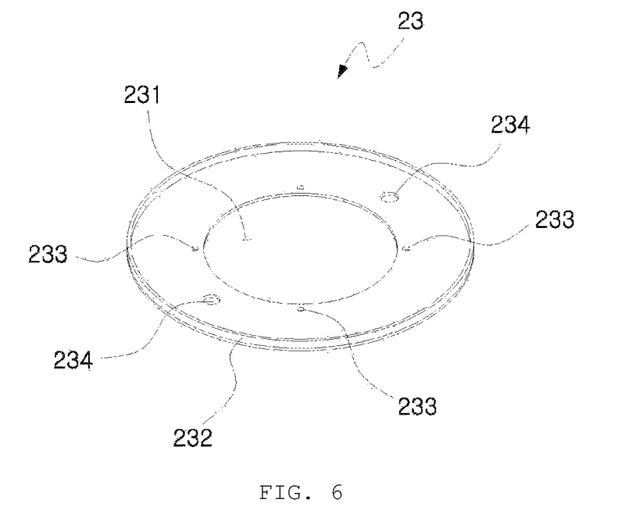
FIG. 6 is a configuration view of a solid edge-open center type collection disc according to another embodiment of the present disclosure.
Figure 7:
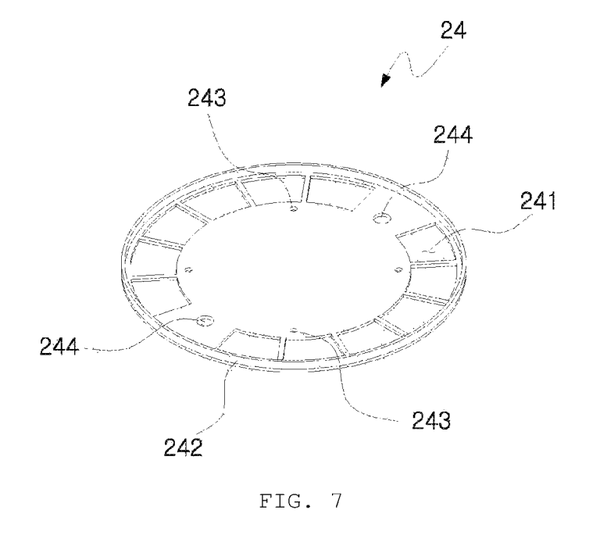
FIG. 7 is a configuration view of an open edge-solid center type collection disc according to another embodiment of the present disclosure.
Figure 8:
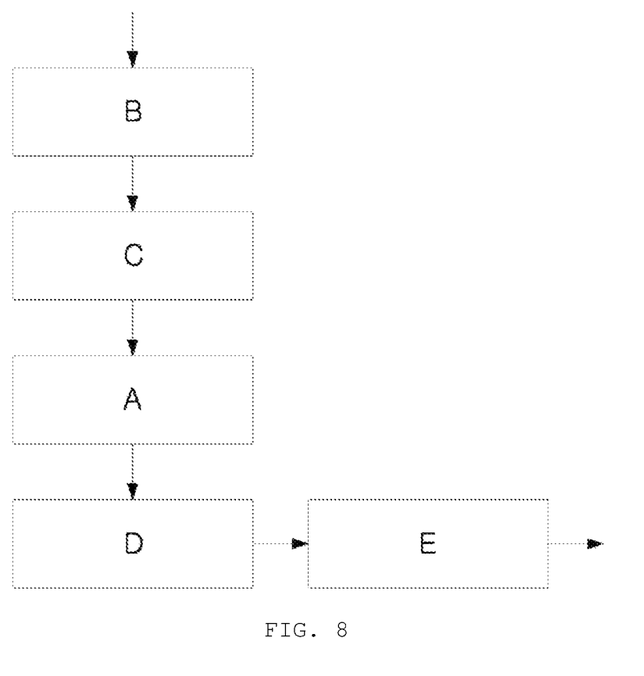
FIG. 8 is an entire configuration view showing the position of an apparatus for collecting by-products according to the present invention.

FIG. 1 is a perspective view of an apparatus for collecting by-products according to an embodiment of the present disclosure, FIG. 2 is a cross-sectional view of an apparatus for collecting by-products according to an embodiment of the present disclosure, FIG. 3 is an entire configuration view of a flow path switching type disc collection tower according to an embodiment of the present disclosure, FIG. 4 is a configuration view of an open edge-mesh center type collection disc according to an embodiment of the present disclosure, FIG. 5 is a configuration view of a mesh edge-open center type collection disc according to another embodiment of the present disclosure, FIG. 6 is a configuration view of a solid edge-open center type collection disc according to another embodiment of the present disclosure, FIG. 7 is a configuration view of an open edge-solid center type collection disc according to another embodiment of the present disclosure, and FIG. 8 is an entire configuration view showing the position of an apparatus for collecting by-products according to the present invention.

The configuration of an apparatus for collecting by-products according to the present disclosure shown in the figures largely includes: a housing 1 forming a main body; and a flow path switching type disc collection tower 2 installed vertically in the housing 1 and collecting by-products from an exhaust gas flowing inside.

The housing 1 is configured in a cylindrical shape, has a top plate 12 having a gas inlet 11 at the top and a bottom plate 14 having a gas outlet 13 protruding and extending inside the housing 1 at a lower portion thereof to discharge an exhaust gas with by-products removed, thereby receiving and then discharging an exhaust gas flowing inside.

The gas inlet formed at the top plate 12 has a shape protruding upward without protruding downward inside the housing 1 such that an exhaust gas flowing inside the housing is uniformly supplied toward the flow path switching type disc collection tower 2 and the inner wall of the housing 1.

The gas outlet 13 formed at the bottom plate 14 has a configuration of which the height extends by not only protruding outward, but also protruding inside the housing 1. The reason of forming this configuration is for increasing the amount of substances collected in the flow path switching type disc collection tower 2 and preventing or reducing of direct leakage of the collected substances to a vacuum pump by generating vortexes around the bottom plate 14 of the housing 1 and the gas outlet 13 having an extending height.

Further, the bottom plate 12→14 has two or more protrusive fastening portions 15 on the top surface, and lower ends of supports 26, which support the load of the flow path switching type disc collection tower 2 are thread-fastened to threads formed in grooves in the fastening portions 15. By this fastening, the flow path switching type disc collection tower 2 is vertically arranged and installed with a predetermined gap from the upper end of the gas outlet.

The flow path switching type disc collection tower largely includes: one or more open edge-mesh center type collection discs 21, mesh edge-open center type collection discs 22, solid edge-open center type collection discs 23, and open edge-solid center type collection discs 24 which have different external shapes; spacer rods 25 disposed vertically through the collection discs to integrate the discs with predetermined gap therebetween; and supports 26 installed to space the collection discs, which are integrated spaced with predetermined gaps therebetween, from the top surface of the bottom plate of the housing to be positioned over the gas outlet so that by-products are collected again while an exhaust gas flowing inside flows zigzag through the center and the edge area of the housing while flowing down.

According to the vertical arrangement structure of the flow path switching type disc collection tower 2, in an embodiment of the present disclosure shown in the figures, the collection discs are vertically arranged in order of the open edge-mesh center type collection disc 21, the mesh edge-open center type collection disc 22, the open edge-mesh center type collection disc 21, the solid edge-open center type collection disc 23, the open edge-solid center type collection disc 24, the solid edge-open center type collection disc 23, and the open edge-solid center type collection disc 24 from the upper end. According to this configuration, an exhaust gas that is finally discharged is not directly discharged to the upper end of the gas outlet protruding upward from the bottom plate and flows up to the upper end around the gas outlet and then flows inside from the bottom surface of the bottom plate.

According to the installation structure of the embodiment described above, when an exhaust gas flowing inside flows down zigzag through the center and the edge area of the housing, non-collected by-products contained in the exhaust gas are collected, and then the exhaust gas flows into a vacuum pump connected to the lower end of the gas outlet through the gas outlet.

The reason of setting the vertical position of the collection discs in accordance with the shapes of the collection discs having various shapes in the flow path switching type disc collection tower 2 is for, first, inducing an exhaust gas to flow zigzag through the center and the edge area, second, for increasing the collection efficiency by extending the flow path of the exhaust gas and increasing the number of hitting of the exhaust gas, third, for using a collection area with high efficiency by positioning the mesh type collection discs upstream such that the initial exhaust gas flowing into the housing through the gas inlet flows to the lower collection discs having a solid structure such that by-products are collected first and then sequentially collected toward the upper end without being collected first at the upper end of the flow path switching type disc collection tower 2, and fourth, for smoothly and continuously collecting by-products with high efficiency in consideration of the growth size (<5 mm) of the by-product by spacing the collection discs vertically with predetermined gaps therebetween.

However, it should be noted that the installation structure and number according to the embodiment shown in the figures do not limit the present disclosure and may be changed in accordance with the size of the housing.

In detail, the configurations of the open edge-mesh center type collection disc 21, mesh edge-open center type collection disc 22, solid edge-open center type collection disc 23, the open edge-solid center type collection disc 24, the spacer rods 25, and the supports 26 are described.

The open edge-mesh center type collection disc 21 is composed of a mesh portion 211 formed at a planar center portion, a plurality of openings 212 circumferentially arranged around the plane, and a guide edge 213 protruding vertically along the circumference.

The mesh portion is formed in a circular shape in an embodiment. The mesh portion concentrates and collects by-products by coming in contact with an exhaust gas flowing inside. The reason of using the mesh type rather than a solid planar type is for guiding an initial exhaust gas flowing into the housing through the gas inlet toward the solid edge-open center type collection disc 23 and the open edge-solid center type collection disc 24 that have a solid structure and positioned below such that by-products are collected first through the collection discs having a solid structure and then sequentially collected toward the upper end rather than being collected a lot first at the upper end by positioning the open edge-mesh center type collection disc 21 upstream in the flow path switching type disc collection tower 2 having a multi-stage structure of collection discs vertically arranged with predetermined gaps therebetween.

The mesh portion 211 has a shape in which a plurality of rectangular or circular individual openings is arranged. Due to this structure, when an exhaust gas vertically moves, load is generated and sub-flow is generated.

A plurality of openings 212 is formed around the circular mesh portion, thereby being passages of main flow for vertical downward flow of the exhaust gas flowing inside.

The guide edge 213 functions as a kind of anti-leakage wall that maximally prevents the exhaust gas flowing inside from flowing outward, that is, toward the inner wall of the housing by protruding upward along the edge, and guides the exhaust gas inward, thereby increasing the collection efficiency. The exhaust gas flowing inside from above can flow to the openings by the guide edge.

A plurality of fastening holes 214 is circumferentially arranged on the plane between the mesh portion and the openings to pass the spacer rods 25 for maintaining gaps and integral welding. A plurality of spacer rods is inserted through the fastening holes 214 as in the embodiment shown in the figures. Although four spacer rods are installed in the embodiment shown in the figures, the installation number does not limit the present disclosure.

The fastening holes 214 and the circumference of the spacer rods 25 inserted through the fastening holes are fixed by welding, thereby spacing the collection discs up and down with predetermined gaps. Accordingly, the spaces defined between the upper and lower collection discs become main flow passages for lateral movement of the exhaust gas flowing inside.

Support holes 215 through which the supports 26 are inserted are formed at at least two of the planes between adjacent openings. The contact portions of the support holes and the supports are fixed by welding. Nuts are fastened to the upper ends of the supports 26 disposed through the support holes of the open edge-mesh center type collection disc 21, thereby fixing the upper end positions.

The mesh edge-open center type collection disc 22 is composed of an opening 221 formed at a planar center portion, two mesh portions 222 circumferentially formed around the plane, and a guide edge 223 protruding vertically upward along the circumference.

The opening 221 has a circular hole structure and becomes a main flow passage for vertical downward movement of the exhaust gas flowing inside.

The mesh portions 222 concentrate and collect by-products by coming in contact with an exhaust gas flowing inside. The reason of using the mesh type rather than a solid planar type is for guiding an initial exhaust gas flowing into the housing through the gas inlet toward the solid edge-open center type collection disc 23 and the open edge-solid center type collection disc 24 that have a solid structure and positioned below such that by-products are collected first through the collection discs having a solid structure and then sequentially collected toward the upper end rather than being collected a lot first at the upper end by positioning the mesh edge-open center type collection disc 22 upstream in the flow path switching type disc collection tower having a multi-stage structure of collection discs vertically arranged with predetermined gaps therebetween.

The mesh portions 222 have a shape in which a plurality of rectangular or circular individual openings is arranged. Due to this structure, when an exhaust gas vertically moves, load is generated and sub-flow is generated.

The guide edge 223 functions as a kind of anti-leakage wall that maximally prevents the exhaust gas flowing inside from flowing outward, that is, toward the inner wall of the housing by protruding upward along the edge, and guides the exhaust gas inward, thereby increasing the collection efficiency. The exhaust gas flowing inside from above can flow to mesh portions by the guide edge.

A plurality of fastening holes 224 is circumferentially arranged on the plane between the mesh portions and the opening to pass the spacer rods 25 for maintaining gaps and integral welding. A plurality of spacer rods is inserted through the fastening holes 224 as in the embodiment shown in the figures. Although four spacer rods are installed in the embodiment shown in the figures, the installation number does not limit the present disclosure.

The fastening holes and the circumference of the spacer rods 25 inserted through the fastening holes are fixed by welding, thereby spacing the collection discs up and down with predetermined gaps. Accordingly, the spaces defined between the upper and lower collection discs become main flow passages for lateral movement of the exhaust gas flowing inside.

Further, support holes 225 through which the supports 26 are inserted are formed at at least two of the planes between adjacent mesh portions. The contact portions of the support holes and the supports are fixed by welding.

The solid edge-open center type collection disc 23 is composed of an opening 231 formed at a planar center portion, and a guide edge 232 protruding vertically upward along the circumference.

The opening 231 has a circular hole structure and becomes a main flow passage for vertical downward movement of the exhaust gas flowing inside.

The plane without the opening becomes a main configuration of collecting by-products by coming in contact with the exhaust gas flowing inside. That is, due to the solid planar shape, by-products in the initial exhaust gas flowing into the housing through the gas inlet are collected first at the lower portion rather than the upper end portion and then sequentially collected toward the mesh edge-open center type collection disc 22 and the open edge-mesh center type collection disc 21 at the upper end by positioning the solid edge-open center type collection disc 23 downstream in the flow path switching type disc collection tower having a multi-stage structure of collection discs vertically arranged with predetermined gaps therebetween.

The guide edge 232 functions as a kind of anti-leakage wall that maximally prevents the exhaust gas flowing inside from flowing outward, that is, toward the inner wall of the housing by protruding upward along the edge, and guides the exhaust gas inward, thereby increasing the collection efficiency. The exhaust gas flowing inside from above can flow to the openings by the guide edge.

Further, a plurality of fastening holes 233 is circumferentially arranged around the opening on the plane without the opening to pass the spacer rods 25 for maintaining gaps and integral welding. A plurality of spacer rods is inserted through the fastening holes as in the embodiment shown in the figures. Although four spacer rods are installed in the embodiment shown in the figures, the installation number does not limit the present disclosure.

The fastening holes and the circumference of the spacer rods 25 inserted through the fastening holes are fixed by welding, thereby spacing the collection discs up and down with predetermined gaps. Accordingly, the spaces defined between the upper and lower collection discs become main flow passages for lateral movement of the exhaust gas flowing inside.

Support holes 234 through which the supports 26 are inserted are formed at at least two of the planes without the opening. The contact portions of the support holes and the supports are fixed by welding.

The open edge-solid center type collection disc 24 is composed of a plurality of openings 241 circularly formed around a plane, and a guide edge 242 protruding vertically upward along the circumference.

A plurality of openings 241 is formed around the circular center plane, thereby being passages of main flow for vertical downward movement of the exhaust gas flowing inside.

The center plane without the opening 241 becomes a main configuration of collecting by-products by coming in contact with the exhaust gas flowing inside. That is, due to the solid planar shape, by-products in the initial exhaust gas flowing into the housing through the gas inlet are collected first at the lower portion rather than the upper end portion and then sequentially collected toward the mesh edge-open center type collection disc 22 and the open edge-mesh center type collection disc 21 at the upper end by positioning the open edge-solid center type collection disc 24 downstream in the flow path switching type disc collection tower having a multi-stage structure of collection discs vertically arranged with predetermined gaps therebetween.

The guide edge 242 functions as a kind of anti-leakage wall that maximally prevents the exhaust gas flowing inside from flowing outward, that is, toward the inner wall of the housing by protruding upward along the edge, and guides the exhaust gas inward, thereby increasing the collection efficiency. The exhaust gas flowing inside from above can flow to the openings by the guide edge.

Further, a plurality of fastening holes 243 is circumferentially arranged around the plane on the center without the opening to pass the spacer rods 25 for maintaining gaps and integral welding. A plurality of spacer rods is inserted through the fastening holes as in the embodiment shown in the figures. Although four spacer rods are installed in the embodiment shown in the figures, the installation number does not limit the present disclosure.

The fastening holes and the circumference of the spacer rods 25 inserted through the fastening holes are fixed by welding, thereby spacing the collection discs up and down with predetermined gaps. Accordingly, the spaces defined between the upper and lower collection discs become main flow passages for lateral movement of the exhaust gas flowing inside.

Further, support holes 244 through which the supports 26 are inserted are formed at at least two of the planes between adjacent openings. The contact portions of the support holes and the supports are fixed by welding.

The spacer rods 25 maintain the gaps between the open edge-mesh center type collection disc 21, the mesh edge-open center type collection disc 22, the solid edge-open center type collection disc 23, and the open edge-solid center type collection disc 24 that are arranged up and down in consideration of the growth size (<5 mm) of by-products when the by-products are concentrated and collected from an exhaust gas flowing in the flow path switching type disc collection tower.

By-products are grown and collected continuously with high efficiency while an exhaust gas flowing inside smoothly flows by the gaps.

The spacer rods 25 that are individual rods are disposed vertically through the fastening holes formed at the same positions on the planes of the open edge-mesh center type collection disc 21, the mesh edge-open center type collection disc 22, the solid edge-open center type collection disc 23, and the open edge-solid center type collection disc 24, and the contact portions with the fastening holes are welded, thereby fixing the vertical positions.

The supports 26 are each composed of a rod-shaped external pipe 261 and a rod-shaped bolt 262 having a thread and inserted in the external pipe 261.

The external pipes are disposed vertically through the support holes formed at the same positions on the planes of the open edge-mesh center type collection disc 21, the mesh edge-open center type collection disc 22, the solid edge-open center type collection disc 23, and the open edge-solid center type collection disc 24, and the contact portions with the fastening portions are welded, thereby being integrally fixed. Thereafter, the bolts are inserted into the external pipes and then coupled to the bottom plate of the housing, whereby the positions are fixed.

The rod-shaped external pipe and the thread inserted therein are longer than the spacer rod 25. The reason is because the spacer rods 25 have a size for spacing the open edge-mesh center type collection disc 21, the mesh edge-open center type collection disc 22, the solid edge-open center type collection disc 23, and the open edge-solid center type collection disc 24, but has also to maintain the open edge-solid center type collection disc 24 at the lowest end over the gas outlet by spacing the integrated flow path switching type disc collection tower 2 apart from the top surface of the bottom plate of the housing while supporting the load of the integrated flow path switching type disc collection tower.

The lower ends of the bolts of the supports 26 are inserted and the fixed by thread-fastening in at least two fastening portions 15 formed on the top surface of the bottom plate 12 of the housing.

Further, the upper ends of the bolts of the supports 26 are disposed through the support holes of the open edge-mesh center type collection disc 21 and fastened by nuts 263, whereby the positions of the upper ends are fixed.

The apparatus A for collecting by-products having the configuration described above in accordance with the present disclosure is an apparatus that is installed between a primary by-product collection apparatus C, which collects by-products in an exhaust gas discharged from a process chamber B in a semiconductor manufacturing process of a semiconductor process, and a vacuum pump D to secondarily collects by-products.

The apparatus A is configured to supply an exhaust gas with by-products removed again to a scrubber E disposed at the rear end of the vacuum pump D.

In particular, the apparatus A for collecting by-products according to the present disclosure is configured in a compact structure to be installed on the upper end of a vacuum pump and removes again non-collected by-products contained in an exhaust gas discharged from a primary by-product collection apparatus to prevent malfunction of the vacuum pump.

The apparatus A for collecting by-products is configured to concentrate and collect particulate substances in noxious gases included in the components of an exhaust gas, which is gas discharged after a thin film deposition process such as $TiCl_4$ (titanium tetrachloride) and $NH_3$ (ammonia) that are used as a process gas in a process chamber performing TiN-ALD and CVD processes, as by-product through a primary by-product collection apparatus, to collect again non-reacted or non-collected by-products contained in the discharged exhaust gas, and finally to supply the by-products to a vacuum pump.

Figure 9:
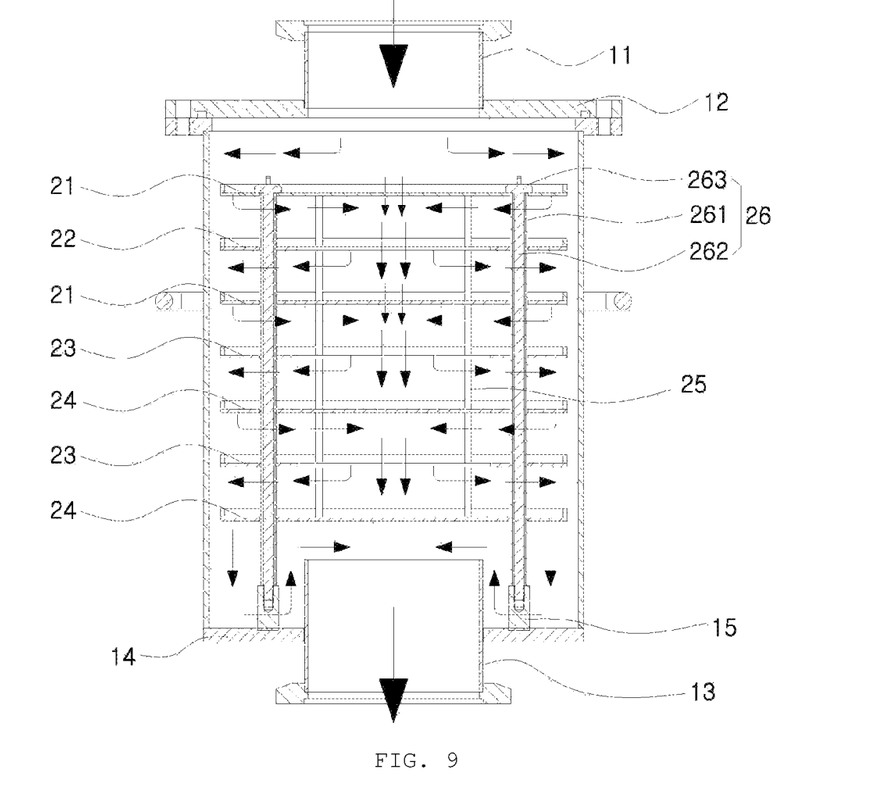
FIG. 9 is a view showing the flow of an exhaust gas in an apparatus for collecting by-products according to an embodiment of the present disclosure.

FIG. 9 is a view showing the flow of an exhaust gas in an apparatus for collecting by-products according to an embodiment of the present disclosure.

As shown in the figures, as for the flow of an exhaust gas flowing in the apparatus for collecting by-products, an exhaust gas, which is discharged from a by-product collection apparatus for primarily collecting by-products in a previous process, flows into the housing 1 through the gas inlet 11 formed at the top plate 12 of the housing 1 and then flows down sequentially through the open edge-mesh center type collection disc 21, the mesh edge-open center type collection disc 22, the open edge-mesh center type collection disc 21, the solid edge-open center type collection disc 23, the open edge-solid center type collection disc 24, the solid edge-open center type collection disc 23, and the open edge-solid center type collection disc 24, which constitute the flow path switching type disc collection tower 2. In this process, the main flow of the exhaust gas flowing in the spaces spaced up and down by the spacer rods 25 goes zigzag to the center and the edge of the housing while going down through the openings, and by-products are collected.

Since the open edge-mesh center type collection disc 21 and the mesh edge-open center type collection disc 22 disposed at the upper end have the mesh portions, and the solid edge-open center type collection disc 23 and the open edge-solid center type collection disc 24 disposed at the lower end have solid planes, by-products are collected first at the lower end with large contact areas and then gradually collected at the upper end.

Further, the exhaust gas is maximally prevented from leaking outward, that is, toward the inner wall of the housing by the guide edges.

On the other hand, the flow path switching type disc collection tower 2 collects by-product in an exhaust gas while generating sub-flow of the exhaust gas downward through the mesh portions of the open edge-mesh center type collection disc 21 and the mesh edge-open center type collection disc 22 that have different external shapes. In this process, the flow slowing down due to the mesh portions meets the main flow of the exhaust gas, and vortexes are generated and the exhaust gas slows down due to a speed difference, whereby more by-products are collected.

The present disclosure is not limited to the specific embodiments and may be modified in various ways without departing from the scope of the present disclosure described in claims by those skilled in the art, and the modifications are included in the scope of the present disclosure.

What is claimed is:

1. An apparatus for collecting by-products that collects again non-collected by-products, which are contained in an exhaust gas that has passed through a primary by-product collection apparatus collecting by-products of an exhaust gas discharged from a process chamber for a semiconductor process, and supplies the exhaust gas to a vacuum pump, the apparatus for collecting by-products comprising:
　a cylindrical housing that has a top plate having a gas inlet and a bottom plate having a gas outlet and fastening portions extending and protruding inside the housing, and receives and then discharges an exhaust gas flowing inside; and a flow path switching disc collection tower that is installed vertically in the housing and collects by-products of an exhaust gas flowing insides,
　wherein the flow path switching disc collection tower includes:
　　one or more open edge-mesh center collection discs,
　　one or more mesh edge-open center collection discs,
　　one or more solid edge-open center collection discs, and
　　one or more open edge-solid center collection discs which have different external shapes and are arranged by combining positions up and down; spacer rods disposed vertically through the collection discs to integrate the discs with predetermined gap therebetween; and
　supports installed to space the collection discs, which are integrated with predetermined gaps therebetween, from a top surface of the bottom plate of the housing to be positioned over the gas outlet.

2. The apparatus of claim 1, wherein a vertical arrangement structure of the flow path switching disc collection tower is configured such that the collection discs are vertically arranged in order of the open edge-mesh center collection disc, the mesh edge-open center collection disc, the open edge-mesh center collection disc, the solid edge-open center collection disc, the open edge-solid center collection disc, the solid edge-open center collection disc, and the open edge-solid center collection disc from an upper top so that by-products are collected first at a lower portion and then gradually collected at an upper portion as the exhaust gas flows down while flowing zigzag through a center and an edge area of the housing.

3. The apparatus of claim 2, wherein the open edge-mesh center collection disc is composed of a mesh portion formed at a planar center portion, a plurality of openings circumferentially arranged around the plane, and a guide edge protruding vertically along a circumference,
   a plurality of fastening holes is circumferentially arranged on the plane between the mesh portion and the openings to pass the spacer rods, and
   support holes through which the supports are inserted are formed at at least two of planes between adjacent openings.

4. The apparatus of claim 2, wherein the mesh edge-open center collection disc is composed of an opening formed at a planar center portion, two mesh portions circumferentially formed around the plane, and a guide edge protruding vertically along a circumference,
   a plurality of fastening holes is circumferentially arranged on the plane between the mesh portions and the opening to pass the spacer rods, and
   support holes through which the supports are inserted are formed at at least two of planes between adjacent mesh portions.

5. The apparatus of claim 2, wherein the solid edge-open center collection disc is composed of an opening formed at a planar center portion, and a guide edge protruding vertically upward along a circumference,
   a plurality of fastening holes is circumferentially arranged around the opening on the plane without the opening to pass the spacer rods, and
   support holes through which the supports are inserted are formed at at least two of planes without the opening.

6. The apparatus of claim 2, wherein the open edge-solid center collection disc is composed of a plurality of openings circularly formed around a plane, and a guide edge protruding vertically upward along a circumference,
   a plurality of fastening holes is circumferentially arranged around the plane of the center without the opening to pass the spacer rods, and
   support holes through which the supports are inserted are formed at at least two of the planes between adjacent openings.

7. The apparatus of claim 1, wherein the spacer rods that are individual rods are disposed vertically through the fastening holes formed at the same positions on the planes of the open edge-mesh center collection disc, the mesh edge-open center collection disc, the solid edge-open center collection disc, and the open edge-solid center collection disc, and then fixed by welding contact portions with the fastening holes, and space the collection discs by a gap considering a growth size (<5 mm) of by-products.

8. The apparatus of claim 1, wherein the supports are each composed of a rod-shaped external pipe and a rod-shaped bolt having a thread and inserted in the external pipe;
   the external pipes are disposed vertically through the support holes formed at the same positions on the planes of the open edge-mesh center collection disc, the mesh edge-open center collection disc, the solid edge-open center collection disc, and the open edge-solid center collection disc, and the contact portions with the fastening portions are welded, thereby being integrally fixed;
   lower ends of the bolts of the supports are inserted and fixed by thread-fastening in at least two fastening portions formed on the top surface of the bottom plate of the housing; and
   upper ends of the bolts of the supports are disposed through the support holes of the open edge-mesh center collection disc and fastened by nuts, whereby the positions of the upper ends are fixed.

* * * * *